(12) United States Patent
Yamaoka et al.

(10) Patent No.: US 11,391,884 B2
(45) Date of Patent: *Jul. 19, 2022

(54) METHOD OF MANUFACTURING LIGHT EMITTING DEVICE

(71) Applicant: NICHIA CORPORATION, Anan (JP)

(72) Inventors: Kensuke Yamaoka, Tokushima (JP); Hiroki Nakai, Anan (JP)

(73) Assignee: NICHIA CORPORATION, Anan (JP)

(*) Notice: Subject to any disclaimer, the term of this patent is extended or adjusted under 35 U.S.C. 154(b) by 476 days.

This patent is subject to a terminal disclaimer.

(21) Appl. No.: 16/370,000

(22) Filed: Mar. 29, 2019

(65) Prior Publication Data

US 2019/0302350 A1 Oct. 3, 2019

(30) Foreign Application Priority Data

Mar. 30, 2018 (JP) ............................. JP2018-067062
Sep. 14, 2018 (JP) ............................. JP2018-172889

(51) Int. Cl.
*B29C 45/14* (2006.01)
*B29C 45/00* (2006.01)
(Continued)

(52) U.S. Cl.
CPC ........ *G02B 6/0065* (2013.01); *B29C 45/0053* (2013.01); *B29C 45/14467* (2013.01);
(Continued)

(58) Field of Classification Search
CPC ................. B29C 45/0053; B29C 45/14467
(Continued)

(56) References Cited

U.S. PATENT DOCUMENTS 8,921,882 B2 * 12/2014 Suenaga ................. H01L 33/50
257/98
10,957,821 B2 * 3/2021 Vampola ................. H01L 27/15
(Continued)

FOREIGN PATENT DOCUMENTS

JP 2012-134355 A 7/2012
JP 2014-127679 A 7/2014
(Continued)

OTHER PUBLICATIONS

Owada, English Translation of JP2012134355 (Year: 2012).*
Sano, English Translation of JP2010219324 (Year: 2010).*

*Primary Examiner* — Matthew J Daniels
*Assistant Examiner* — Hana C Page
(74) *Attorney, Agent, or Firm* — Foley & Lardner LLP

(57) ABSTRACT

A method of manufacturing a light emitting device includes: mounting a light emitting element on a substrate; disposing a light shielding frame on a sheet, the light shielding frame having an opening; disposing a plate-shaped light transmissive member in the opening, the plate-shaped light transmissive member having a first face and a second face opposite the first face, wherein an outer perimeter of the first face is smaller than an inner perimeter of the opening; forming a light guide support member by filling the space with a first light reflecting member; bonding the light guide support member by bonding an upper face of the light emitting element and the second face of the light transmissive member; and forming a second light reflecting member surrounding the light emitting element by filling the space between the substrate and the light shielding frame with a second reflecting resin.

7 Claims, 8 Drawing Sheets

(51) Int. Cl.
*F21V 8/00* (2006.01)
*B29L 31/34* (2006.01)

(52) U.S. Cl.
CPC ......... *G02B 6/0003* (2013.01); *G02B 6/0055* (2013.01); *G02B 6/0088* (2013.01); *B29L 2031/34* (2013.01)

(58) Field of Classification Search
USPC ........................................................ 156/242
See application file for complete search history.

(56) References Cited

U.S. PATENT DOCUMENTS

| | | |
|---|---|---|
| 2016/0093780 A1* | 3/2016 | Beppu ................. H01L 21/3213 257/98 |
| 2016/0093781 A1 | 3/2016 | Tamaki et al. |
| 2016/0334077 A1 | 11/2016 | Wakamatsu et al. |
| 2016/0348876 A1 | 12/2016 | Azuma et al. |
| 2016/0351766 A1 | 12/2016 | Hayashi et al. |
| 2017/0155022 A1 | 6/2017 | Tomonari et al. |
| 2017/0256674 A1 | 9/2017 | Hashimoto |
| 2018/0040583 A1 | 2/2018 | Tamaki et al. |

FOREIGN PATENT DOCUMENTS

| | | |
|---|---|---|
| JP | 2016-072471 A | 5/2016 |
| JP | 2016-219794 A | 12/2016 |
| JP | 2016-225501 A | 12/2016 |
| JP | 2016-225515 A | 12/2016 |
| JP | 2017-108091 A | 6/2017 |
| JP | 2017-157723 A | 9/2017 |
| JP | 2017-201666 A | 11/2017 |

\* cited by examiner

METHOD OF MANUFACTURING LIGHT EMITTING DEVICE

CROSS-REFERENCE TO RELATED APPLICATION

This application claims priority to Japanese Patent Application No. 2018-067062, filed on Mar. 30, 2018, and Japanese Patent Application No. 2018-172889, filed on Sep. 14, 2018, the disclosures of which are hereby incorporated by reference in their entireties.

BACKGROUND

The present disclosure relates to a method of manufacturing a light emitting device.

High output light emitting devices constructed with light emitting elements such as LEDs have been used as light sources in the automotive applications, and the like. For example, Japanese Patent Publication No. 2014-127679 discloses a high output light emitting device for use as an automotive light source having enhanced heat dissipation performance by virtue of a heat dissipation layer formed so as to cover the periphery of the light emission face of the light emitting element. According to the Japanese Patent Publication No. 2014-127679, the light emitting device disclosed therein can achieve sharp-edged light distribution characteristics in addition to improved heat dissipation properties because of the heat dissipation layer formed to cover the periphery of the light emission face of the light emitting element, which is said to be suited, for example, for automotive headlamp applications. The phrase "sharp-edged light distribution" in that patent publication to mean that there is a large luminance difference between the inside and the outside of the light emission surface.

However, there is a need for more efficient extraction of light emitted from light emitting elements in light emitting devices for use as high output light sources for automotive applications and the like. Furthermore, there is a need for an inexpensive method of manufacturing such light emitting devices.

Accordingly, one object of the present disclosure is to provide an inexpensive method of manufacturing a light emitting device achieving a large luminance difference between the inside and the outside of the light emission surface, as well as efficient extraction of the light emitted by the light emitting elements.

According to a first embodiment, a method of manufacturing a light emitting device includes: mounting a light emitting element on a substrate; disposing on a sheet a light shielding frame having an opening; disposing in the opening a plate-shaped light transmissive member having a first face and a second face on the opposite side of the first face where the outer perimeter of the first face is smaller than the inner perimeter of the opening such that the first face opposes the sheet and a space is created between the light transmissive member and the opening; forming a light guide support member by forming and filling the space with a first light reflecting member such that the first light reflecting member supports the light shielding frame and the light transmissive member; bonding the light guide support member by bonding the upper face of the light emitting element and the second face to thereby secure the light guide support member on the light emitting element; and forming a second light reflecting member surrounding the light emitting element by filling the space between the substrate and the light shielding frame with a second reflecting resin.

According to a second embodiment, a method of manufacturing a light emitting device includes: mounting a light emitting element on a substrate; disposing on a sheet a light shielding frame having an opening; applying a coating of a first light reflecting resin on the light shielding frame; forming a light guide support member by forming a first light reflecting member by allowing a light transmissive member, which has a plate shape, a first face and a second face on the opposite side of the first face where the outer perimeter of the first face is smaller than the inner perimeter of the opening and the outer perimeter of the second face is larger than the opening, to come into contact with the first light reflecting resin at the position to form a space between the light transmissive member and the opening so that the first face opposes the sheet and subsequently be pressed allowing the first light reflecting resin to flow into the space such that the first light reflecting member supports the light shielding frame and the light transmissive member; bonding the light guide support member by bonding the upper face of the light emitting element and the second face to thereby secure the light guide support member on the light emitting element; and forming a second light reflecting member surrounding the light emitting element by filling the space between the substrate and the light shielding frame with a second reflecting resin.

According to a third embodiment, a method of manufacturing a light emitting device includes: mounting a light emitting element on a substrate; disposing on a sheet a light shielding frame having an opening; applying a coating of a first light reflecting resin on the light shielding frame; forming a light guide support member by forming a first light reflecting member by allowing a light transmissive member, which has a plate shape, a first face and a second face on the opposite side of the first face where the outer perimeter of the first face is smaller than the inner perimeter of the opening and a portion of the outer perimeter of the second face is larger than the opening, to come into contact with the first light reflecting resin at the position to form a space between the light transmissive member and the opening so that the first face opposes the sheet and subsequently be pressed allowing the first light reflecting resin to flow into the space such that the first light reflecting member supports the light shielding frame and the light transmissive member; bonding the light guide support member by bonding the upper face of the light emitting element and the second face to thereby secure the light guide support member on the light emitting element; and forming a second light reflecting member surrounding the light emitting element by filling the space between the substrate and the light shielding frame with a second reflecting resin.

The methods of manufacturing a light emitting device according to the first to third embodiments of the present invention described above can be used to inexpensively manufacture a light emitting device that can achieve a large luminance difference between the inside and the outside of the light emission surface, as well as efficient extraction of the light emitted by the light emitting element.

DETAILED DESCRIPTION

Figure 1A:
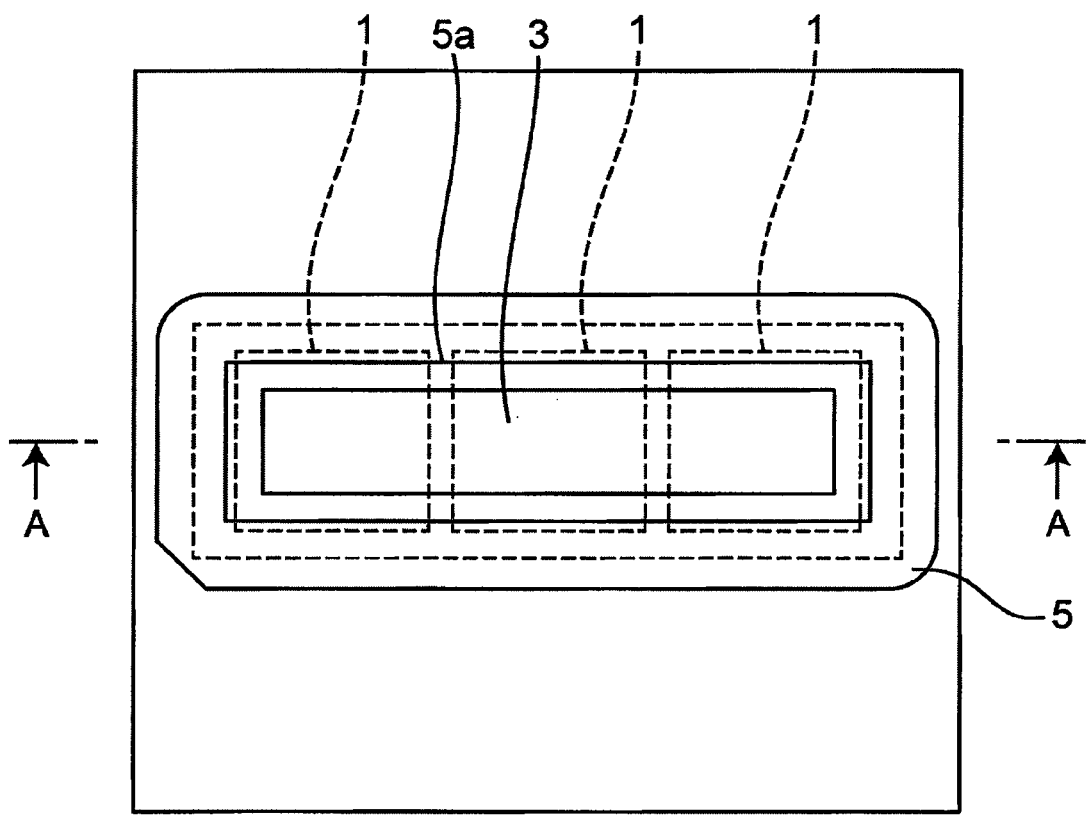
FIG. 1A is a plan view of an example of the light emitting device manufactured by the method of manufacturing a light emitting device according to the first or second embodiment of the present disclosure.

In a manufacturing method according to one embodiment of the present invention, a substrate on which a light emitting element is mounted, and a light guide support member in which a light shielding frame and a light transmissive member are supported by a light reflecting member are first prepared. Then the light guide support member is transferred onto the light emitting element mounted on the substrate, and a light reflecting member is formed to surround the light emitting element. Such a method can more efficiently manufacture light emitting devices because in manufacturing multiple light emitting devices, a substrate including multiple unit regions on which light emitting elements can be prepared, followed by disposing a light guide support member having a light shielding frame and a light transmissive member that are supported by a light reflecting member can be disposed on each unit region of the substrate.

The methods of manufacturing light emitting devices according to the first to the third embodiments of the present invention and the light emitting devices produced by the methods (hereinafter occasionally referred to as "light emitting devices according to the embodiments of the invention") will be explained below with reference to the drawings. However, the embodiments explained below are for putting shape to the technical ideas of the present invention, and are not intended to limit the present invention. The drawings referred to in the explanations below are schematic illustrations of the embodiments of the present invention. As such, relative sizes of, spacing and the positional relationship between the members may be exaggerated, or portions of the members may be omitted.

Light Emitting Devices According to Embodiments

As shown in FIG. 1A, FIG. 1B, and FIGS. 2A to 2F, the light emitting devices according to the embodiments of the invention include a substrate 10, light emitting elements 1 disposed on the substrate 10, and a plate-shaped light transmissive member 3 disposed so that its second face faces a light emission face of the light emitting elements 1. It further includes a first light reflecting member 9a disposed to bond portions of the lateral faces of the light transmissive member 3 and the opening 5a of a light shielding frame having an opening while exposing the first face 3a of the light transmissive member 3, which is a light emission surface of the light emitting device, and a second light reflecting member 9b disposed between the first light reflecting member 9a and the substrate 10 to cover the lateral faces of the light emitting element 1. Hereinafter, the first light reflecting member 9a and the second light reflecting member 9b are occasionally collectively referred to as a "light reflecting member."

In the light emitting devices according to the embodiments, the light shielding frame 5 having an opening 5a is disposed on the upper face of the light reflecting member that surrounds the light transmissive member 3 so that the first face 3a of the light transmissive member 3 is positioned on or inward of the opening 5a, and the first face 3a of the light transmissive member 3 is exposed from the first light reflecting member 9a and the light shielding frame 5.

In the light emitting devices according to the embodiments, in particular, the inner perimeter of the opening 5a is positioned apart from the outer perimeter of the light emission surface (i.e., the first face 3a of the light transmissive member 3), and the first light reflecting member 9a is exposed between the inner perimeter of the opening 5a and the outer perimeter of the first face 3a in a plan view as seen from above (i.e., from the light emission surface side). In this manner, on the upper face of the light emitting device, the light transmissive member 3 is separated from the light shielding frame 5 by interposing the surface of the first light reflecting member 9a. Also, the lateral faces of the light emitting elements 1 and the lateral faces of the light transmissive member 3 are separated from the light shielding frame 5 by interposing the light reflecting member.

The light emitting devices according to the embodiments structured as above can achieve a large luminance difference between the light emission surface and the area surrounding the light emission surface, and allows for efficient extraction of the light emitted by the light emitting elements. In the light emitting devices according to the embodiments, the spacing between the inner perimeter of the opening 5a and the outer perimeter of the light emission surface 3a is preferably set to at least 5 μm and 150 μm at most, more preferably at least 40 μm and 60 μm at most, in order to achieve both objects: a large luminance difference between the inside and the outside of the light emission surface 3a; and efficient extraction of the light emitted by the light emitting elements.

Various embodiments of the light emitting device will be explained below.

In the light emitting devices according to the embodiments, the area of the second face 3b of the light transmissive member 3 is larger than the area of the first face 3a (i.e., the light emission surface of the light emitting device) of the light transmissive member 3.

By making the area of the first face 3a of the light transmissive member 3 smaller than that of the second face 3b, the light entering the second face 3b of the light transmissive member 3 can exit from the first face 3a (i.e., the light emission surface of the light emitting device) that is a smaller area. That is, this can realize a high luminance light emitting device that light emitted from the light emitting element transmits through the light transmissive member 3 having a narrowed light emission surface area. Accordingly, such a light emitting device can illuminate at a greater distance. A light emitting device having high front luminance is particularly suited for automotive lighting such as headlights. There are various regulations or standards related to the colors of automotive lighting, for example, the color of front lamps (e.g., headlights) must be white or light yellow, and all of them must have the same color.

Figure 1B:
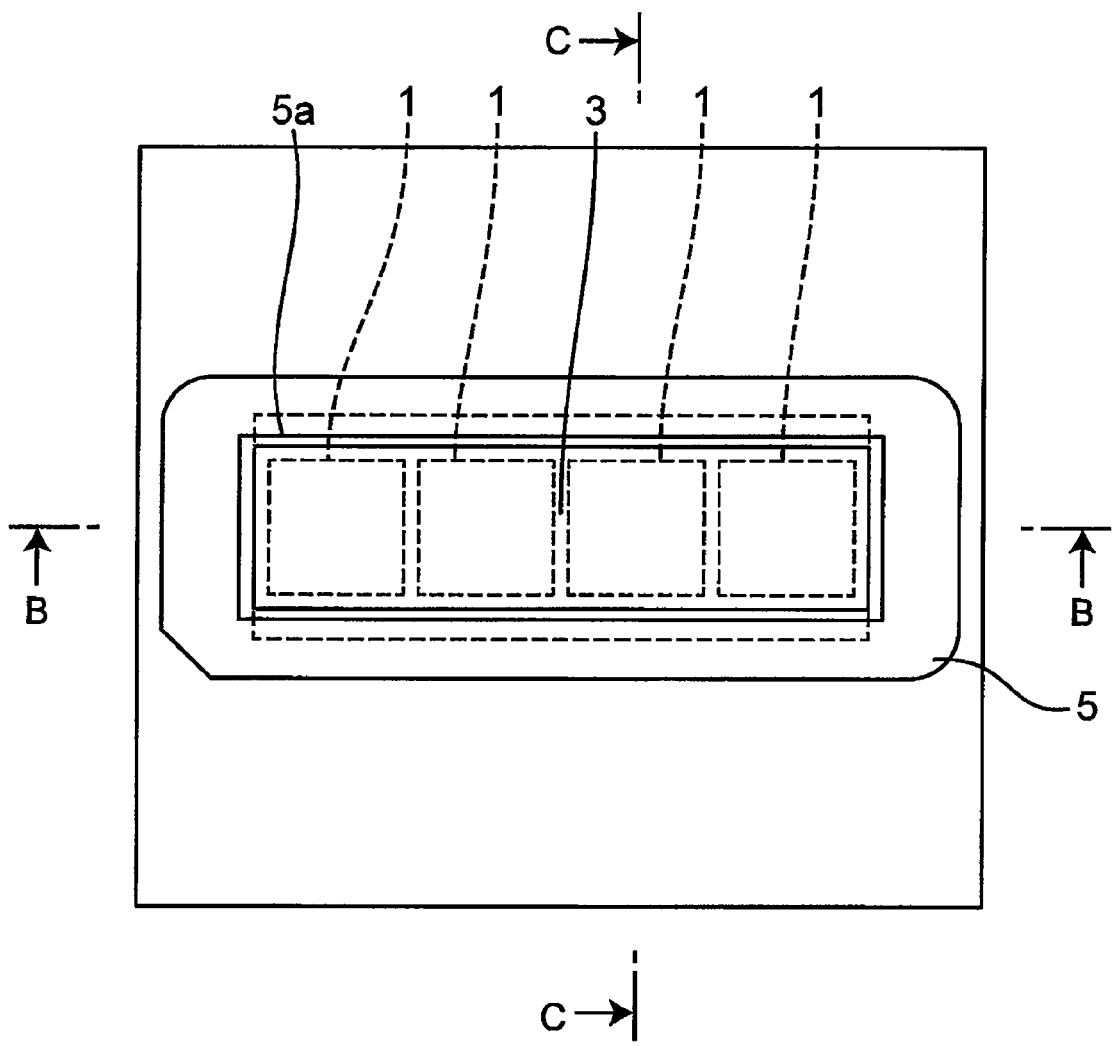
FIG. 1B is a plan view of an example of the light emitting device manufactured by the method of manufacturing a light emitting device according to the first or third embodiment of the present disclosure.

Furthermore, at least a portion of the outer perimeter of the second face 3b of the light transmissive member 3 is preferably positioned outward of the inner perimeter of the opening 5a of the light shielding frame 5 in a plan view as seen from above. In the case of the light emitting device according to the embodiment shown in FIG. 1A, the entire outer perimeter of the second face 3b is positioned outward of the inner perimeter of the opening 5a in a plan view as seen from above. In the case of the light emitting device according to the embodiment shown in FIG. 1B, portions of the outer perimeter of the second face 3b are positioned outward of the inner perimeter of the opening 5a in a plan view as seen from above. In the case in which the outer perimeter of the second face 3b of the light transmissive member 3 is rectangular, at least one side, preferably two opposing sides, of the outer perimeter are preferably positioned outward of the inner perimeter of the opening 5a of the light shielding frame 5. Furthermore, if the outer perimeter of the second face 3b of the light transmissive member 3 is rectangular with short and long sides, it is preferable to structure the member so that the long sides of the outer perimeter are positioned outward of the inner perimeter of the opening 5a of the light shielding frame 5 as shown in FIG. 1B. The lateral faces of the light transmissive member 3 may have stepped portions so as to form collars having a certain thickness, or may have oblique faces in part or whole as shown in FIG. 2A, FIG. 2C, FIG. 2D, FIG. 2F, and FIGS. 3 to 6. In the case in which the lateral faces of the light transmissive member 3 are oblique faces, the oblique surfaces may be flat or curved surfaces. Moreover, at least one lateral face of the light transmissive member 3 may be rectangular in shape as shown in FIG. 2B and FIG. 2E.

Positioning the outer perimeter of the second face 3b of the light transmissive member 3 on the outside of the inner perimeter of the opening 5a in part or whole in a plan view as seen from above, and positioning the outer perimeter of the first face 3a of the light transmissive member 3 on the inside of the inner perimeter of the opening 5a in a plan view as seen from above in this manner can achieve the effect described below.

That is, in a plan view as the light emitting device is seen from above (i.e., from the light emission face side), the first face 3a of the light transmissive member 3 and the upper face of the first light reflecting member 9a that surrounds the outer perimeter of the first face 3a of the light transmissive member 3 can be visually recognized in the opening 5a. At this point, in the region on the inside of the opening 5a, the oblique faces and/or the collars of the light transmissive member 3 are located under at least a portion of the light reflecting member. There is a possibility that a crack or delamination is generated in the regions of the first light reflecting member 9a in the vicinity of the oblique faces and/or the collars of the light transmissive member 3 inside of the opening 5a. Even if the crack or delamination is generated in such regions, only light that has already passed through the light transmissive member 3 passes through the cracked or delaminated portion in such regions and exits from the opening 5a. From the perspective of increasing the effect, as shown in FIG. 1A, it is more preferable to locate the entire outer perimeter of the second face 3b of the light transmissive member 3 on the outside of the inner perimeter of the opening 5a of the light shielding frame 5 in a plan view as seen from above. Furthermore, if the outer perimeter of the second face 3b of the light transmissive member 3 is rectangular with short and long sides, at least the long sides of the outer perimeter of the second face 3b are preferably positioned on the outside of the inner perimeter of the opening 5a of the light shielding frame 5 as described earlier.

Furthermore, because the light leaking from the light reflecting member is shielded in the region covered by the light shielding frame 5, even if a crack or delamination occurs in the second light reflecting member 9b located along the lateral faces of the light emitting elements 1, for example, the light from the lateral faces of the light emitting elements 1 traveling through a crack or delaminated location and leaking towards the light emission surface side can be more effectively reduced.

For example, a light emitting device that emits white light by mixing blue light emitted by the light emitting elements 1 and yellow light resulting from converting the wavelength of a portion of the blue light can be applied as automotive lighting. In this case, if the blue light emitted by the light emitting elements 1 leaks out, in addition to the white light emitted from the light emission surface, a chromaticity difference would result in the opening 5a, which might allow for emission color variance to occur in the irradiated area. Furthermore, if the leaked blue light is visually recognized, the regulations or standards for automotive lighting described above would not be satisfied, and might compromise the safety of the vehicle.

In the light emitting device according to one embodiment, as shown in FIG. 1A, the outer perimeter of the first face 3a of the light transmissive member 3 is positioned on or inward of the outer perimeter of the light emitting elements 1 in a plan view as seen from above. In the case in which a plurality of light emitting elements 1 are included in the light emitting device as shown in FIG. 1A, the outer perimeter of the light emitting elements 1 is defined as the outer perimeter of the plurality of light emitting elements 1 as a whole, excluding the outer perimeter portions positioned between adjacent ones of light emitting elements.

In this manner, the light from the plurality of light emitting elements 1 can be collected and emitted from the emission face 3a of the light transmissive member 3. Accordingly, light emitted from the light emitting elements 1 can exit from the upper face (i.e., the light emission surface) of the light transmissive member 3 with higher density of luminous flux.

In the case of the light emitting device according to another embodiment, as shown in FIG. 1B, the outer perimeter of the first face 3a of the light transmissive member 3 is positioned inward of the outer perimeter of the light emitting elements 1 in a plan view as seen from above. In this manner, the density of luminous flux at the emission face of the light emitting device can be adjusted to a given luminous flux density by appropriately setting the areas of the emission faces of the light emitting elements and the area of the first face 3a of the light transmissive member (i.e., the emission face of the light emitting device).

Figure 2A:
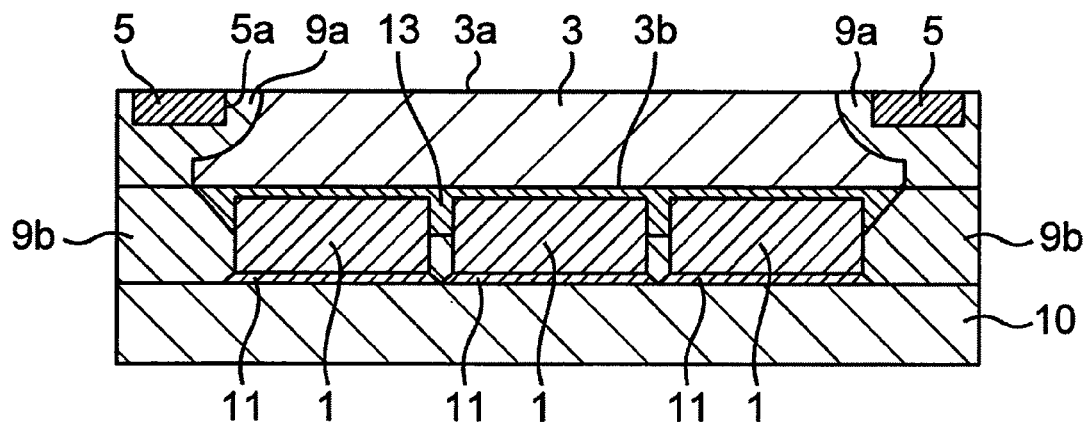
FIG. 2A is a cross-sectional view of the light emitting device manufactured by the method of manufacturing a light emitting device according to the first embodiment taken along line A-A in FIG. 1A.
Figure 2B:
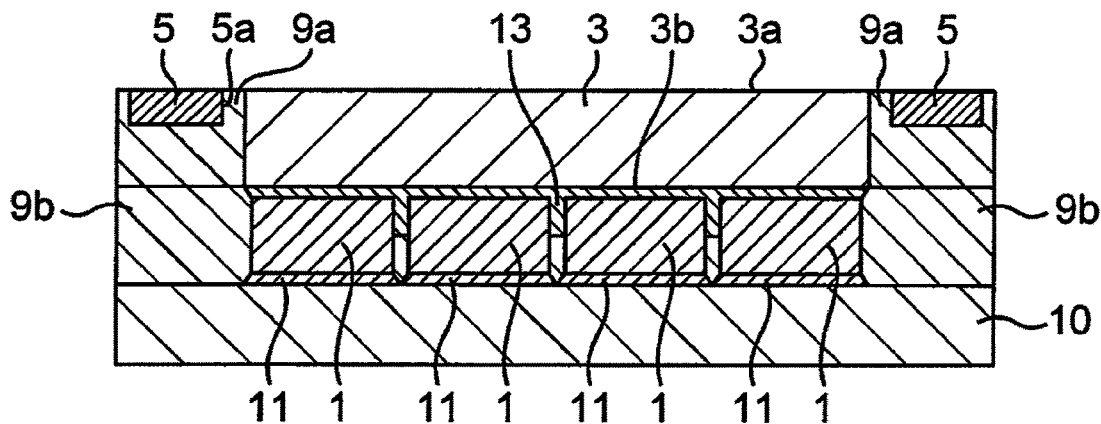
FIG. 2B is a cross-sectional view of the light emitting device manufactured by the method of manufacturing a light emitting device according to the first embodiment taken along line B-B in FIG. 1B.
Figure 2C:
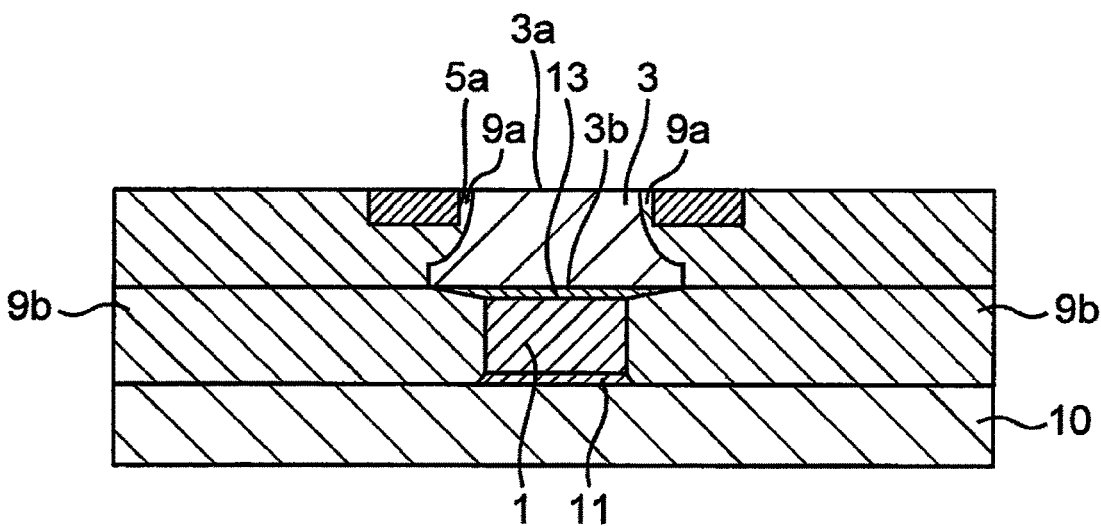
FIG. 2C is a cross-sectional view of the light emitting device manufactured by the method of manufacturing a light emitting device according to the first embodiment taken along line C-C in FIG. 1B.
Figure 2D:
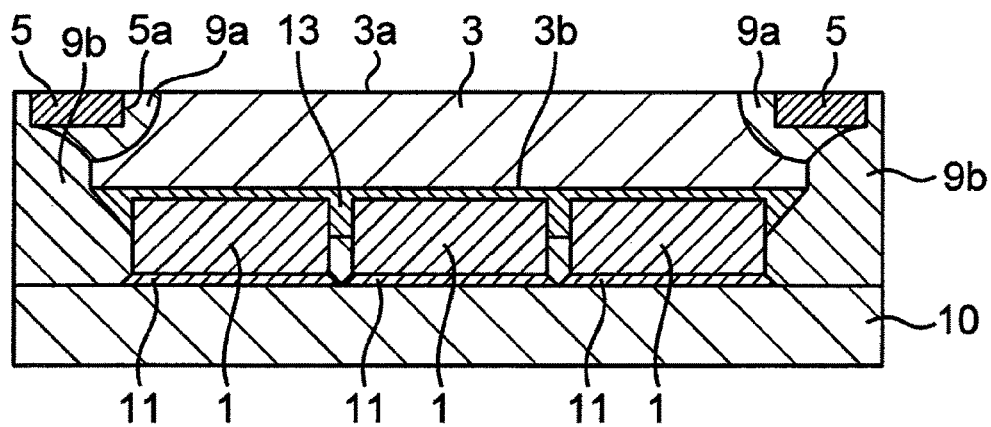
FIG. 2D is a cross-sectional view of the light emitting device manufactured by the method of manufacturing a light emitting device according to the second embodiment taken along line A-A in FIG. 1A.
Figure 2E:
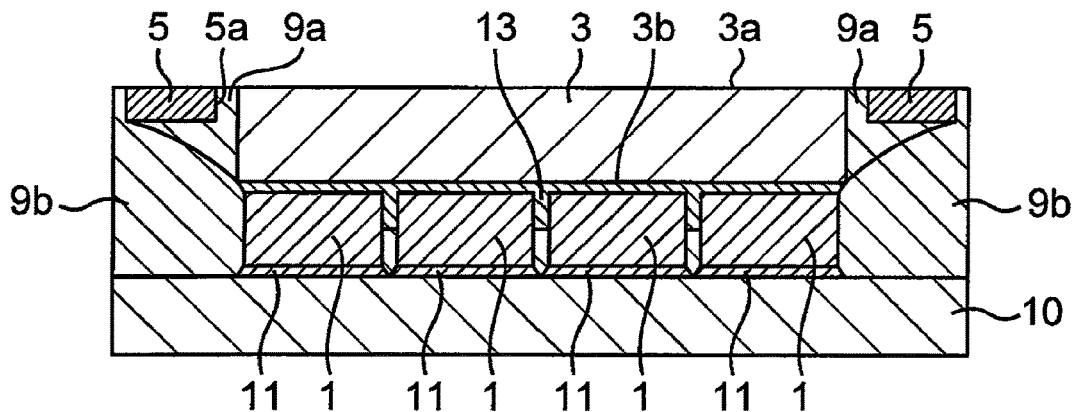
FIG. 2E is a cross-sectional view of the light emitting device manufactured by the method of manufacturing a light emitting device according to the third embodiment taken along line B-B in FIG. 1B.
Figure 2F:
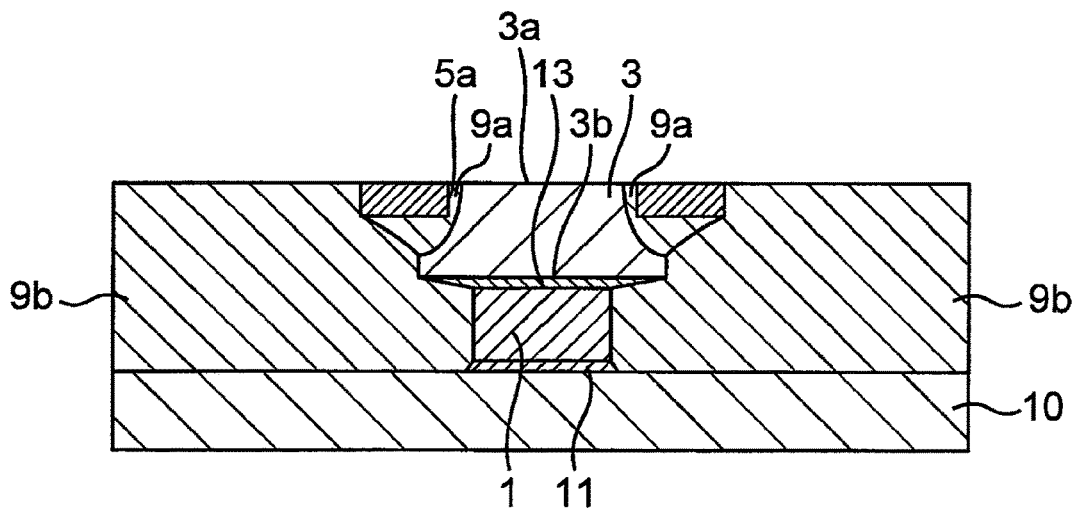
FIG. 2F is a cross-sectional view of the light emitting device manufactured by the method of manufacturing a light emitting device according to the third embodiment taken along line C-C in FIG. 1B.
Figure 3:
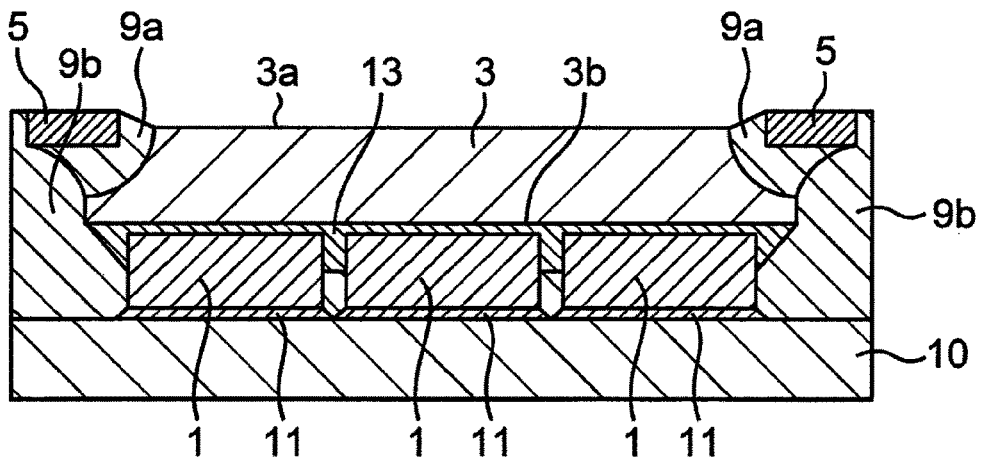
FIG. 3 is a cross-sectional view of an example of the light emitting device in the case of the method of manufacturing a light emitting device according to the second embodiment taken along line A-A in FIG. 1A.
Figure 4:
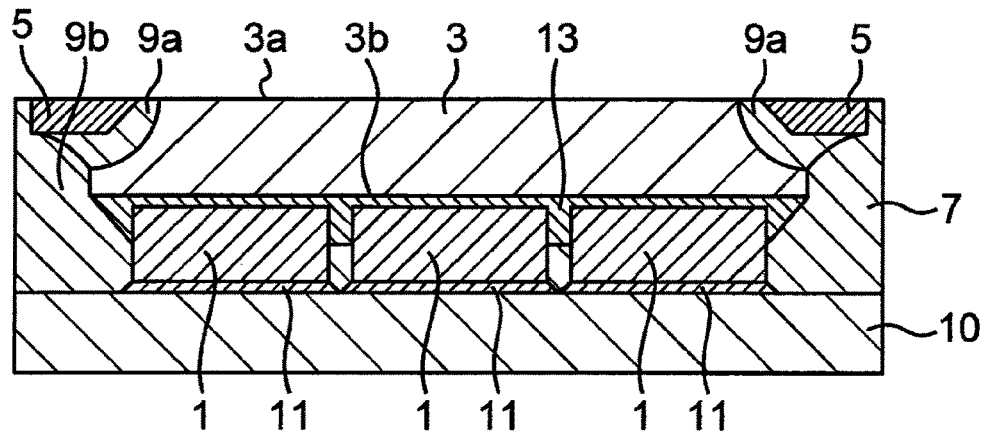
FIG. 4 is a cross-sectional view of an example of the light emitting device in the case of the method of manufacturing a light emitting device according to the second embodiment taken along line A-A in FIG. 1A.
Figure 5:
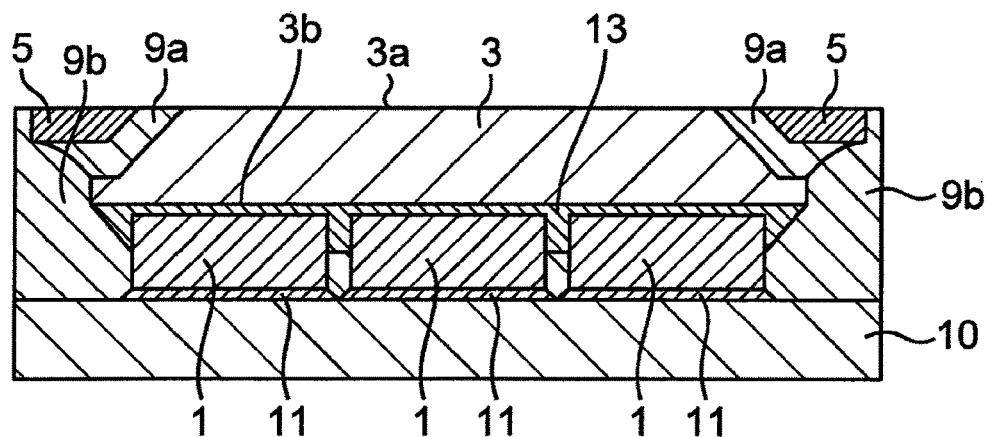
FIG. 5 is a cross-sectional view of an example of the light emitting device in the case of the method of manufacturing a light emitting device according to the second embodiment taken along line A-A in FIG. 1A.

In the light emitting devices according to the embodiments, the first face 3a of the light transmissive member 3 may be positioned at the same height as the upper face of the light shielding frame 5 (i.e., coplanar) as shown in FIGS. 2A to 2F and FIGS. 4 to 6, or may be positioned lower than the upper face of the light shielding frame 5 as shown in FIG. 3. In the case in which the first face 3a of the light transmissive member 3 is positioned lower than the upper face of the light shielding frame 5, the first face 3a of the light transmissive member 3 and the upper face of the light shielding frame 5 are preferably in parallel to one another. Even in the case in which the first face 3a of the light transmissive member 3 is positioned lower than the upper face of the light shielding frame 5, the light reflecting member is preferably disposed to cover the lateral faces of the light emitting elements 1 and the lateral faces of the light transmissive member 3 while exposing the first face 3a of the light transmissive member 3, i.e., the emission face of the light emitting device. In this case, the light reflecting member is preferably disposed to cover the inner perimeter of the opening of the light shielding frame positioned above the first face 3a of the light transmissive member 3. The end faces along the inner perimeter of the light shielding frame 5 may be oblique as shown in FIG. 4 and FIG. 5. The light emitting devices having no resin walls 7 such as those shown in FIGS. 2A to 5 have the advantage of having smaller sizes than those having resin walls 7.

Figure 6:
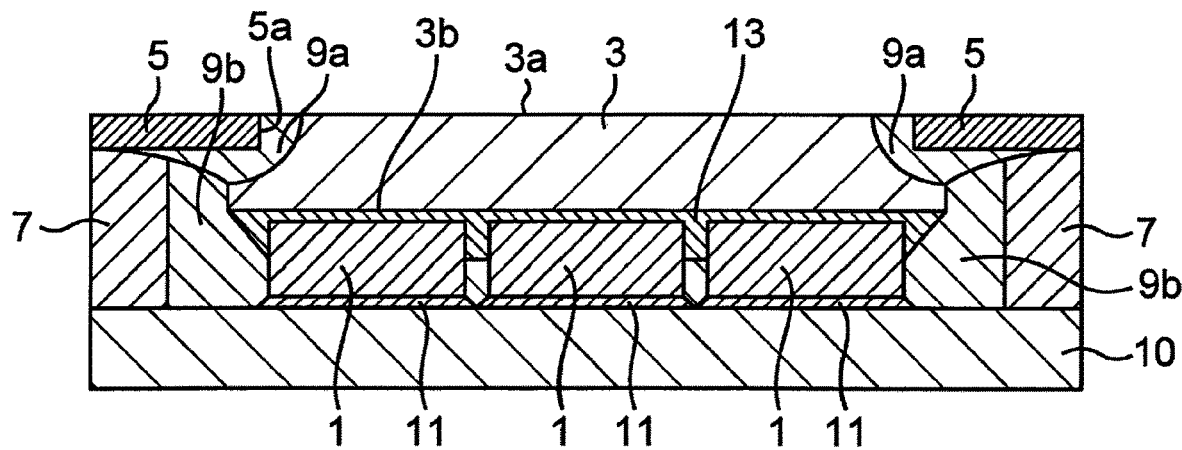
FIG. 6 is a cross-sectional view of an example of the light emitting device in the case of the method of manufacturing a light emitting device according to the second embodiment taken along line A-A in FIG. 1A.

In the light emitting devices according to the embodiments, resin walls 7 may be disposed between the substrate 10 and the light shielding frame 5 as shown in FIG. 6. The resin walls 7 may be disposed on the outside of the light reflecting member, for example, so as to surround the light reflecting member or oppose one another with the light reflecting member interposed therebetween. This can more effectively prevent the delamination of the light shielding frame 5.

Each constituent element of the light emitting device according to the embodiments will be explained below.

Substrate 10

The substrate 10 is a member that supports light emitting elements 1, and has at least at its surface a wiring pattern to be electrically connected to the external electrodes of the light emitting elements 1. The primary material for the substrate 10 is preferably an insulation material that is less likely to transmit the light from the light emitting elements 1 as well as light from the outside. Specific examples include: ceramics, such as alumina and aluminum nitride; and resins, such as phenol resins, epoxy resins, polyimide resins, BT resin, polyphthalamide, and the like. In the case of using a resin, inorganic fillers, such as glass fibers, silicon oxide, titanium oxide, alumina, or the like, may be mixed into the resin as needed. This can reinforce the mechanical strength, reduce the thermal expansion coefficient, and increase the reflectance. The substrate 10 may be one constructed by forming an insulation material on the surface of a metal material. The wiring having a predetermined pattern is formed on the insulation material. For the wiring material, at least one selected from gold, silver, copper, palladium, nickel and aluminum can be used. The wiring pattern may be formed by plating, vapor deposition, sputtering or the like.

Light Emitting Element 1

For the light emitting element 1, a light emitting diode is preferably used. A light emitting element having a given wavelength can be selected. For example, for a blue or green light emitting element, one employing a nitride semiconductor ($In_XAl_YGa_{1-X-Y}N$, $0 \leq X$, $0 \leq Y$, $X+Y \leq 1$), ZnSe, GaP or the like can be used. For a red light emitting element, GaAlAs, AlInGaP, or the like can be used. Furthermore, a semiconductor light emitting element comprising materials other than the above can alternatively be used. The compositions, emission colors, sizes, and the number of light emitting elements used can be suitably selected depending on the purpose. In the case of including a phosphor in the light emitting device, a nitride semiconductor ($In_XAl_YGa_{1-X-Y}N$, $0 \leq X$, $0 \leq Y$, $X+Y \leq 1$) capable of emitting short wavelength light to efficiently excite the phosphor can be used. The emission wavelength can be selected by varying the semiconductor layer materials and the mixed crystal ratio.

The light emitting elements 1 used in the light emitting device according to the embodiments, for example, include positive and negative electrodes on the same face, which are flip-chip mounted on a substrate 10 so that the positive and negative electrodes are connected via conductive bonding members 11 as shown in FIG. 2A. In FIG. 2A the conductive bonding members 11 that are connected to the positive and negative electrodes of the light emitting elements 1 are drawn in a simplified manner, but are actually disposed to be individually connected to the positive and negative electrodes formed on the same face. The positive and negative electrodes of the light emitting elements 1 are individually connected to the positive and negative wires (not shown) disposed on the substrate 10 via the conductive bonding members 11. The light emitting elements 1 are mounted on the substrate with the faces where the electrodes are formed as the lower faces, and the upper faces, which oppose the lower faces, serve as the primary light emission faces. Because such a light emitting element 1 is connected to the substrate using conductive bonding members, such as bumps or conductive paste, as described above, contact areas between the electrodes and the substrate can be increased, thereby reducing contact resistance, as compared to a light emitting element that is connected using electric wires or the like.

The light emitting element 1, for example, is a light emitting element having a stack of nitride semiconductor layers formed on a light transmissive sapphire growth substrate. The sapphire substrate is the upper face side of the light emitting element 1, serving as the primary light emission surface. The growth substrate can be removed, for example, by polishing, LLO (laser lift off), or the like.

Light Transmissive Member 3

The light transmissive member 3 is a member that transmits and externally releases the light emitted from the light emitting elements 1. The light transmissive member 3 may contain a diffuser as well as a phosphor that can convert the wavelength of at least a portion of the light entering thereto. The light transmissive member 3 can be formed with, for example, a resin, glass, inorganic material, or the like. A phosphor-containing light transmissive member can be, for example, a sintered body of a phosphor, or a phosphor-containing resin, phosphor-containing glass, phosphor-containing ceramic, or another inorganic material in which phosphor is contained. Alternatively, a phosphor-containing resin layer may be formed on the surface of a resin, glass, ceramic, or another inorganic material. The thickness of the light transmissive member 3, for example, is about 50 μm to about 300 μm.

Bonding between the light transmissive member 3 and the light emitting elements can be achieved, for example, via a light guide member 13 as shown in FIG. 2A. The light transmissive member 3 may be bonded to the light emitting elements 1 by using a direct bonding method, such as pressure bonding, sintering, surface activated bonding, atomic diffusion bonding, or hydroxyl group bonding, instead of using a light guide member 13.

Phosphor

As described above, the light transmissive member 3 may contain a phosphor. For the phosphor that can be include in the light transmissive member 3, a phosphor that is excitable by the light emitted from the light emitting elements 1 is used. Examples of phosphors excitable by light emitted from a blue light emitting element or ultraviolet light emitting element include cerium-activated yttrium aluminum garnet-based phosphors (Ce:YAG); cerium-activated lutetium aluminum garnet-based phosphors (Ce:LAG); europium- and/or chromium-activated nitrogen-containing calcium aluminosilicate-based phosphors (Eu:CaO—$Al_2O_3$—$SiO_2$); europium-activated silicate-based phosphors (Eu:$(Sr,Ba)_2SiO_4$); nitride-based phosphors, such as β-SiAlON phosphors, CASN-based phosphors represented by Eu:$CaAlSiN_3$, and SCASN-based phosphors represented by Eu:$(Sr,Ca)AlSiN_3$; KSF-based phosphors represented by $K_2SiF_6$:Mn; sulfide-based phosphors, and quantum dot phosphors. By combining these phosphors with a blue or ultraviolet light emitting element, light emitting devices of various emission colors (e.g., a white light emitting device) can be produced.

Light Shielding Frame 5

The light shielding frame 5 is a member disposed for reducing the luminance of the portion of the upper face of the light emitting device excluding the light emission surface. In order to reduce the luminance of the portion excluding the light emission surface, the light externally leaking from areas other than the first face 3a of the light transmissive member 3 needs to be shielded. Considering this functionality, the light shielding frame 5 is preferably constructed with, for example, a member comprising a material that reflects and/or absorbs light without transmitting light, or a member equipped with a film comprising a material that reflects and/or absorbs light without transmitting light on the surface.

The material for constructing the light shielding frame 5 can be selected from resins (including fiber reinforced resins), ceramics, glass, paper, metals, and composite materials comprising two or more of these materials. Specifically, the light shielding frame 5 is preferably constructed with, for example, a metal frame comprising a metal or a frame having a metal film on the surface, that is a material having light shielding properties and is not prone to degradation. Examples of metal materials include copper, iron, nickel, chromium, aluminum, gold, silver, titanium, or their alloys.

The light shielding frame 5 more preferably has the functionality of not only attenuating light leakage from the light emitting device, but also attenuating reflection of the external light. Examples of the functionality of attenuating reflection of external light include providing the surface of the light emission side surface with micro-protrusions and micro-recesses, employing a material having high light absorption, and the like. For example, the surface having micro-protrusions and micro-recesses has the arithmetic average roughness Ra of from 0.5 μm to 1.0 μm. Micro-protrusions and micro-recesses provided on the light shielding frame surface increase the wettability of a liquid with the light shielding frame surface, thereby facilitating the wetting and spreading of an uncured resin material on the light shielding frame surface. For this reason, it is preferable to not provide micro-protrusions and micro-recesses, for example, at the edges of the upper face of the light shielding frame. Materials having high light absorption include black nickel plating, black chrome plating, and the like.

The thickness of the light shielding frame 5 (i.e., the height from the lower face to the upper face of the light shielding frame 5) is preferably about 20 μm to about 200 μm, more preferably about 30 μm to about 80 μm to achieve the light weight and resistance to deformation while maintaining the mechanical strength when the light emitting device is in use.

The light shielding frame 5 may be disposed so that the outer perimeter of the light shielding frame 5 coincides with the outer perimeter of the light emitting device in a plan view, but is preferably disposed such that the outer perimeter of the light shielding frame 5 is located on the inside of the outer perimeter of the light emitting device. In this manner, the light shielding frame 5 would not be positioned on the dividing lines during the step of dividing into unit regions, i.e., dividing into individual light emitting devices, described below, reducing the misalignment of the light shielding frame 5 and the like during the dividing step.

The outer perimeter of the light shielding frame 5 being on the inside of the outer perimeter of the light emitting device here includes cases of disposing the light shielding frame 5 so that a portion of the outer perimeter of the light shielding frame 5 is positioned on the inside of the outer perimeter of the light emitting device.

The width of the light shielding frame 5 in a plan view is preferably at least 130 µm, considering the effect of increasing the luminance difference between the inside and the outside of the light emission face 3a. Furthermore, considering the ease of handling during manufacturing, the width is preferably 500 µm or larger. The width of the light shielding frame 5 may be constant across the entire perimeter, but may vary in part. In the case in which the width of the light shielding frame 5 varies in part, it is more preferable for the width to be at least 130 µm across the entire perimeter and at least 500 µm in part.

First Light Reflecting Member 9a and Second Light Reflecting Member 9b

The light reflecting member, i.e., the first light reflecting member 9a and the second light reflecting member 9b, covers the lateral faces of the light emitting elements 1 and the lateral faces of the light transmissive member 3, reflecting the light exiting from the lateral faces of the light emitting elements 1 and the lateral faces of the light transmissive member 3 to release the light from the light emission surface. By providing the light reflecting member covering the lateral faces of the light emitting elements 1 and the lateral faces of the light transmissive member 3 in this manner, light extraction efficiency can be increased. The light reflecting member, for example, can be formed with a light reflecting material having a high reflectance. Specifically, a light reflecting material having a reflectance of at least 60%, preferably at least 80% or 90%, relative to the light from the light emitting elements can be used for the light reflecting member. The light reflecting material is constructed with, for example, a resin containing a light reflecting substance. As described in detail below, the first light reflecting member 9a and the second light reflecting member 9b are separately formed by using different light reflecting materials or the same light reflecting material.

With respect to the first light reflecting resin 9c that forms the first light reflecting member 9a and the second light reflecting resin 9d that forms the second light reflecting member 9b, for the base material of resin for constructing these, a silicone resin, modified silicone resin, epoxy resin, modified epoxy resin, acrylic resin, or a hybrid resin containing at least one of these resins can be used. The light reflecting member can be formed by having the base resin material contain a reflecting substance. Examples of the light reflecting substance include titanium dioxide, silicon oxide, zirconium oxide, magnesium oxide, yttrium oxide, yttria stabilized zirconia, calcium carbonate, calcium hydroxide, calcium silicate, niobium oxide, zinc oxide, barium titanate, potassium titanate, magnesium fluoride, alumina, aluminum nitride, boron nitride, mullite or the like. Preferably, titanium dioxide ($TiO_2$) is used. Also preferably, particles of a light reflecting substance having a different refractive index from a refractive index of the base resin material are dispersed in the base resin. The amount of reflection and the amount of transmission vary depending on the concentration or density of the light reflecting substance contained. The concentration and density can suitably be adjusted in accordance with the shape or the size of the light emitting device. The light reflecting member may contain other pigments, phosphors, or the like, in addition to the light reflecting substance. When containing a phosphor in the light transmissive member 3, in particular, having the second light reflecting resin 9d also contain a similar phosphor can make it less likely for the leakage of the light emitted by the light emitting elements from the lateral faces of the light emitting device to be visually recognized.

Light Guide Member 13

In the light emitting device, as described above, the bonding between the light transmissive member 3 and the light emitting elements is achieved, for example, via the light guide member 13. The light guide member 13, as shown in FIG. 2A, may cover the lateral faces of the light emitting elements 1 in whole or part. In the case in which a portion of the second face 3b of the light transmissive member 3 is not opposing the upper faces of the light emitting elements 1, which are primary light emission surfaces, the light guide member 13 is preferably formed to cover the portion of the light transmissive member 3 that does not oppose the upper faces of the light emitting elements. The light guide member 13 is also interposed between the light emitting elements and the light transmissive member 3, bonding them together. The light guide member 13 constructed as above can efficiently guide the light emitted from the upper faces and the lateral faces of the light emitting elements 1 to the light transmissive member 3.

It is preferable to use a resin material for the light guide member 13 from the perspective of ease of handling and processing. Examples of the resin material include a resin containing one or more of silicone resins, modified silicone resins, epoxy resins, modified epoxy resins, acrylic resins, fluoro-resins, a hybrid thereof, or the like. The light guide member 13 can be formed in the shape described above by suitably adjusting the viscosity of the resin material for forming the light guide member 13, and the wettability of the resin material with the light emitting elements 1.

Other Members

The light emitting device may appropriately include other elements such as protective devices, electronic parts, and the like. These elements and electronic parts are preferably embedded in the light reflecting member.

Method of Manufacturing a Light Emitting Device According to the First Embodiment The method of manufacturing a light emitting device according to the first embodiment includes: mounting a light emitting element on a substrate; disposing on a sheet a light shielding frame having an opening; disposing in the opening a plate-shaped light transmissive member having a first face and a second face on the opposite side of the first face, where the outer perimeter of the first face is smaller than the inner perimeter of the opening, such that the first face opposes the sheet and a space is created between the light transmissive member and the opening; forming a light guide support member by forming and filling the space with a first light reflecting member such that the first light reflecting member supports the light shielding frame and the light transmissive member; bonding the light guide support member by bonding the upper face of the light emitting element and the second face to thereby secure the light guide support member on the light emitting element; and forming a second light reflecting member surrounding the light emitting element by filling the space between the substrate and the light shielding frame with a second reflecting resin.

The method of manufacturing a light emitting device according to the first embodiment can produce a light emitting device shown, for example, in FIG. 1A, FIG. 1B, and FIGS. 2A to 2C.

The method of manufacturing a light emitting device according to the first embodiment will be explained below with reference to the drawings.

Mounting Step

Figure 7A:
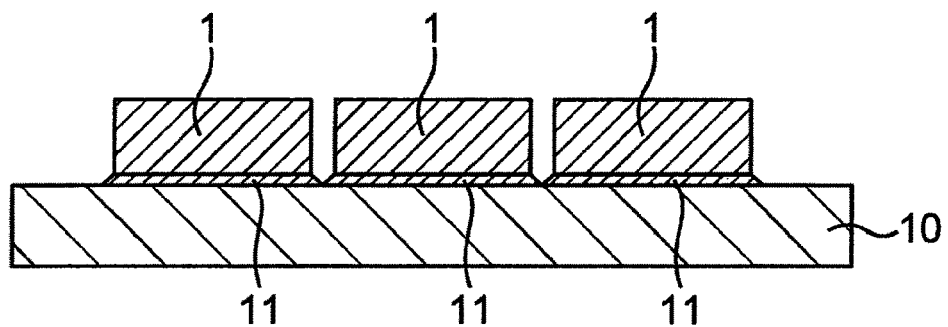
FIG. 7A is a cross-sectional view after light emitting elements are mounted in the method of manufacturing a light emitting device according to the first embodiment.

As shown in FIG. 7A, the one or more light emitting elements 1 are flip-chip mounted on the substrate 10.

Specifically, for example, light emitting elements 1 having both the positive and negative electrodes (not shown) on the lower faces are individually bonded by using conductive bonding members 11 so that the positive electrodes face the positive wires disposed on the substrate 10, and the negative electrodes face the negative wires disposed on the substrate 10. In FIGS. 7A, 7E and 7F, similar to FIG. 2A and the like, the illustrations are simplified without distinguishing the conductive bonding members 11 that are connected to the positive and negative electrodes of the light emitting elements 1 and the positive and negative wires (not shown) disposed on the substrate 10.

Light Shielding Frame Disposing Step

Figure 7B:
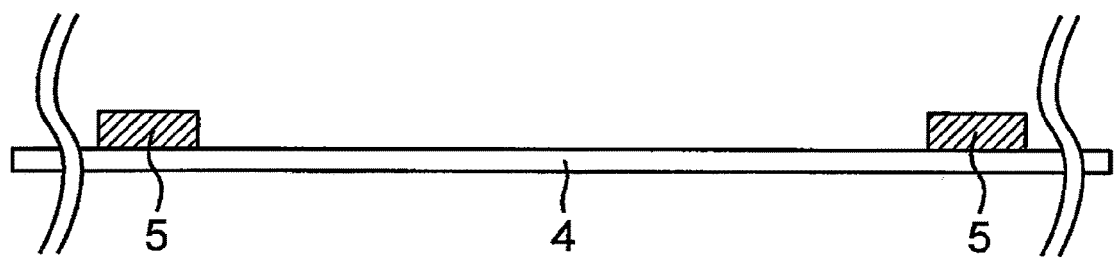
FIG. 7B is a cross-sectional view after a light shielding frame is disposed on a sheet in the method of manufacturing a light emitting device according to the first embodiment.

Here, a light shielding frame 5 having an opening 5a and a sheet 4 are prepared, and the light shielding frame 5 is disposed on the sheet 4 as shown in FIG. 7B.

A plurality of light shielding frames prepared to a prescribed shape beforehand may be individually disposed on the sheet, or a plurality of light shielding frames that are linked in rows and columns of unit regions may be placed on the sheet as a group. For the sheet, a heat resistant sheet having a tacky surface is preferably used. Examples of the base material for the sheet include polyimide.

Light Transmissive Member Disposing Step

Figure 7C:
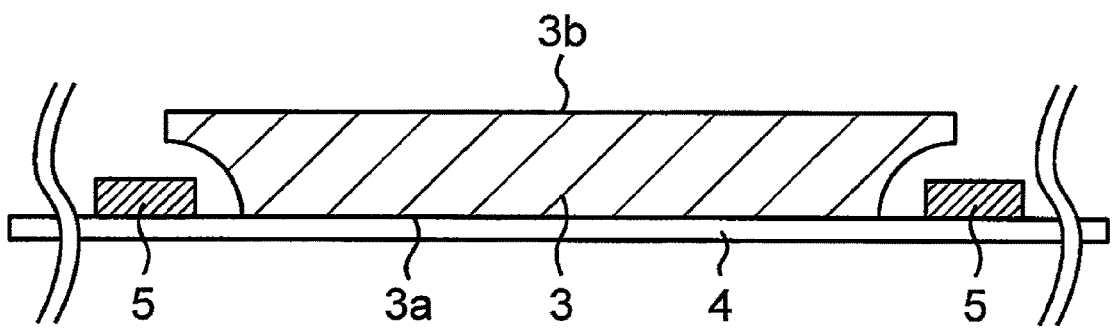
FIG. 7C is a cross-sectional view after a light transmissive member is disposed on the sheet in the method of manufacturing a light emitting device according to the first embodiment.

Here, using a plate-shaped light transmissive member 3 having a first face 3a and a second face 3b on the opposite side of the first face 3a where the outer perimeter of the first face is smaller than the inner perimeter of the opening 5a of the light shielding frame 5, as shown in FIG. 7C, the light transmissive member 3 is disposed in the opening so that the first face 3a of the light transmissive member 3 faces the sheet and a space is created between the light transmissive member 3 and the light shielding frame 5.

Specifically, for example, the light transmissive member 3 is positioned while being suctioned by a suction collet so that the inner perimeter of the opening 5a of the light shielding frame 5 is positioned on the outside of the outer perimeter of the first face 3a of the light transmissive member whereupon the suction collet is lowered to dispose the light transmissive member 3 on the sheet.

When manufacturing a light emitting device of the embodiment shown in FIGS. 1A and 2A, the light transmissive member 3 employed has the second face 3b whose outer perimeter is larger than the inner perimeter of the opening 5a of the light shielding frame 5. For example, in the case in which both the opening 5a and the second face 3b are rectangular in shape having long sides and short sides, a light transmissive member in which both the long and short sides of the second face 3b are respectively larger than the long and short sides of the opening 5a is used. When manufacturing a light emitting device of the embodiment shown in FIGS. 1B and 2B, the light transmissive member 3 used has a second face 3b in which portions of the outer perimeter are larger than the portions of the inner perimeter of the opening 5a of the light shielding frame 5 that correspond to the portions of the second face 3b. For example, in the case in which both the opening 5a and the second face 3b are rectangular in shape having long sides and short sides, one in which the short sides of the second face 3b are larger than the short sides of the opening 5a is used.

Light Guide Support Member Forming Step

Figure 7D:
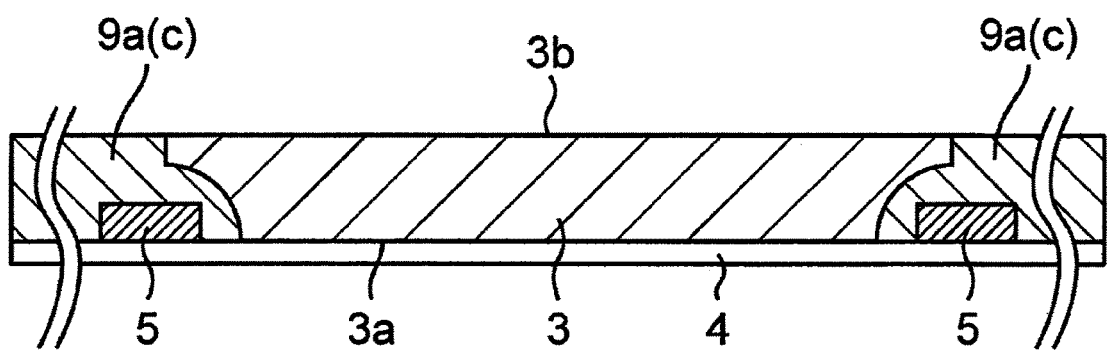
FIG. 7D is a cross-sectional view after a light guide support member is formed in the method of manufacturing a light emitting device according to the first embodiment.
Figure 7E:
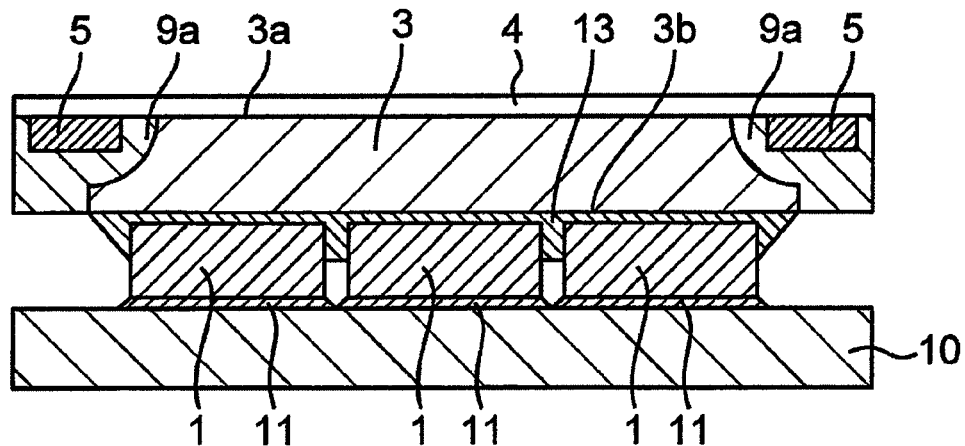
FIG. 7E is a cross-sectional view after the light guide support member is secured on the light emitting elements in the method of manufacturing a light emitting device according to the first embodiment.
Figure 7F:
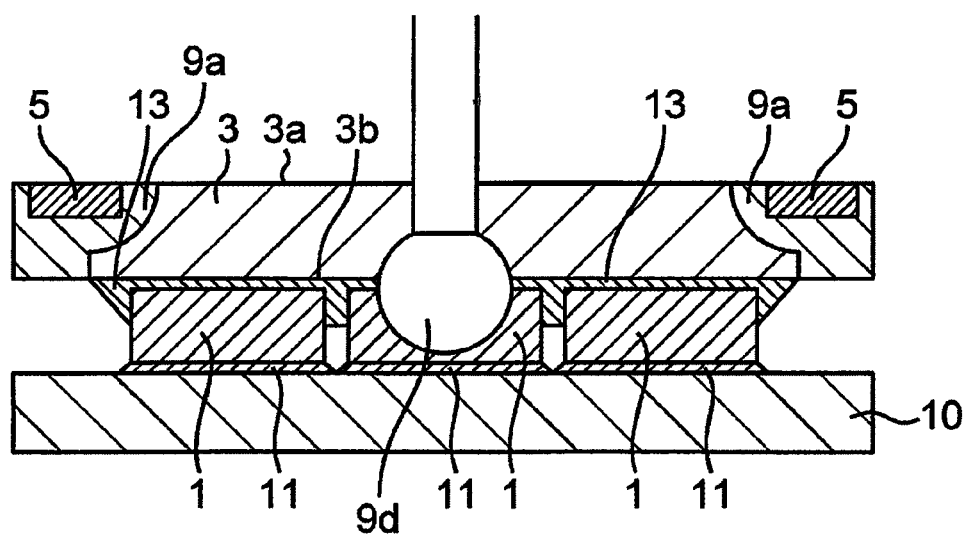
FIG. 7F is a cross-sectional view showing a light reflecting resin being supplied in the method of manufacturing a light emitting device according to the first embodiment.

Here, as shown in FIG. 7D, a light guide support member is prepared in which the light shielding frame 5 and the light transmissive member 3 are supported by a first light reflecting member 9a.

Specifically, for example, the space between the light transmissive member 3 and the opening 5a of the light shielding frame 5 is filled with a first light reflecting resin 9c injected thereto from the tip of the nozzle of a resin dispenser. The first light reflecting resin 9c fills the space between the light transmissive member 3 and the opening 5a of the light shielding frame 5 by flowing along the light transmissive member into the space.

Subsequent to filling the space between the light transmissive member 3 and the opening 5a of the light shielding frame 5 with the first light reflecting resin 9c, the first light reflecting resin 9c is cured to form the first light reflecting member 9a.

Light Guide Support Member Bonding Step

Here, as shown in FIG. 7E, the light guide support member is fixed on the light emitting elements 1 by bonding the second face 3b of the light transmissive member 3 to the emission faces (the upper faces) of the light emitting elements 1.

After aligning the light transmissive member 3 of the light guide support member obtained as described above with the light emitting elements 1, the light transmissive member 3 is bonded to the emission faces of the light emitting elements 1 by using, for example, the light guide member 13.

When manufacturing a light emitting device of the embodiment shown in FIG. 1A and FIG. 2A, the light guide support member is aligned, for example, such that (i) the outer perimeter of the second face 3b of the light transmissive member 3 is positioned on the outside of the outer perimeter of the light emitting elements 1 in a plan view as seen from above, and (ii) the outer perimeter of the first face 3a of the light transmissive member 3 is positioned on the inside of the outer perimeter of the light emitting elements 1 in a plan view as seen from above.

When manufacturing a light emitting device of the embodiment shown in FIG. 1B and FIG. 2B, the light guide support member is aligned, for example, such that (i) the outer perimeter of the second face 3b of the light transmissive member 3 is positioned on the outside of the outer perimeter of the light emitting elements 1 in a plan view as seen from above, and (ii) the outer perimeter of the first face 3a of the light transmissive member 3 is positioned on the outside of the outer perimeter of the light emitting elements 1 in a plan view as seen from above.

In bonding the light transmissive member 3 of the light guide support member and the light emitting elements 1, the light transmissive member 3 with the light guide member 13 precoated on the second face 3b may be disposed on the light emitting elements 1, or the light transmissive member 3 of the light guide support member may be placed on the light emitting elements 1 after coating the upper faces of the emitting elements 1 with the light guide member 13. The coating amount of light guide member 13, the load applied when pressing the light transmissive member 3 onto the light emitting elements 1, and if a resin material is used as the light guide member 13, the viscosity of the resin material during application may be appropriately set by taking into consideration the desired shape of the light guide member 13 to be achieved once bonded to the light transmissive member 3 of the light guide support member to the light emitting elements 1.

Sheet Removal Step

The sheet 4 may be removed subsequent to the step of bonding the light guide support member or in the sheet removal step subsequent to the step of forming the second light reflecting member.

Second Light Reflecting Member Forming Step

Here, a light reflecting member (i.e., a first light reflecting member 9a and a second light reflecting member 9b) that surrounds the light emitting elements 1 and the light transmissive member 3 between the substrate 10 and the light shielding frame 5 is formed by filling the space between the substrate 10 and the light shielding frame 5 with an uncured second light reflecting resin 9d for forming the second light reflecting member 9b. In the methods of manufacturing a light emitting device according to the embodiments, for example, a light shielding frame 5 slightly smaller than the substrate 10 (i.e., the outer edges of the frame are contained in the substrate 10 in a plan view) is used and the space between the substrate 10 and the light shielding frame 5 is filled with a second light reflecting resin 9d from the outer perimeter side of the light shielding frame. FIG. 7F illustrates an example in which the sheet 4 has been removed before the step of forming the second light reflecting member.

After filling the space between the substrate 10 and the light shielding frame 5 with a second light reflecting resin 9d, the second light reflecting resin 9d is cured.

The light emitting devices according to the embodiments are manufactured in the manner described above.

Other Steps

In the light emitting devices according to the embodiments, resin walls 7 may be formed between the substrate 10 and the light shielding frame 5 as shown in FIG. 6. In the case of manufacturing such a light emitting device, the manufacturing method includes a resin wall forming step before the step of bonding the light guide support member. In the resin wall forming step, the resin walls are formed at the positions that provide a prescribed space from the opening of the light shielding frame 5 and the light transmissive member 3 while interposing the opening and the light transmissive member. For the resin walls 7, those having a prescribed height are formed on the light shielding frame 5 and/or the substrate 10. The resin walls 7 are formed by using a resin material having the viscosity to allow the resin walls 7 to maintain their shapes while being interposed between the substrate 10 and the light shielding frame 5. Moreover, the resin walls 7 are not completely cured, maintaining the flexibility to be deformed by pressing force.

In this manner, the resin walls 7 made of an uncured resin material are cured while being interposed between the substrate 10 and the light shielding frame 5 and being pressed and deformed by the light guide support member. Because this can easily secure the light shielding frame 5 at a prescribed height position, height variability of the light emitting devices can be reduced in the process of manufacturing of the light emitting devices.

The resin walls 7 may be ultimately removed. In the case of removing the resin walls 7, the manufacturing method includes a resin wall removal step subsequent to the step of forming the second reflecting member. The resin wall removal step may remove the peripheral portion of the light shielding frame on the resin walls together with the resin walls, thereby achieving a smaller light emitting device.

Method of Manufacturing a Light Emitting Device According to the Second Embodiment The method of manufacturing a light emitting device according to the second embodiment includes: mounting a light emitting element on a substrate; disposing on a sheet a light shielding frame having an opening; applying a coating of a first light reflecting resin on the light shielding frame; forming a light guide support member by forming a first light reflecting member by allowing a light transmissive member, which has a plate shape, a first face and a second face on the opposite side of the first face where the outer perimeter of the first face is smaller than the inner perimeter of the opening and the outer perimeter of the second face is larger than the opening, to come into contact with the first light reflecting resin at the position to form a space between the light transmissive member and the opening so that the first face opposes the sheet and subsequently be pressed allowing the first light reflecting resin to flow into the space such that the first light reflecting member supports the light shielding frame and the light transmissive member; bonding the light guide support member by bonding the upper face of the light emitting element and the second face to thereby secure the light guide support member on the light emitting element; and forming a second light reflecting member surrounding the light emitting element by filling the space between the substrate and the light shielding frame with a second reflecting resin.

In the method of manufacturing a light emitting device according to the second embodiment, when both the opening 5a of the light shielding frame 5 and the second face 3b of the light transmissive member 3 are rectangular in shape having long and short sides, for example, the light emitting device of the embodiment shown in FIG. 1A and FIG. 2D, for example, can be produced by using the light transmissive member having the second face 3b in which both the long and short sides are larger than the long and short sides of the opening 5a.

The method of manufacturing a light emitting device according to the second embodiment will be explained below with reference to the drawings.

Light Emitting Element Mounting Step and Light Shielding Frame Disposing Step

The light emitting element mounting step and the light shielding frame disposing step are similar to those in the method of manufacturing a light emitting device according to the first embodiment, for which the explanations will be omitted.

First Light Reflecting Resin Coating Step

Figure 8A:
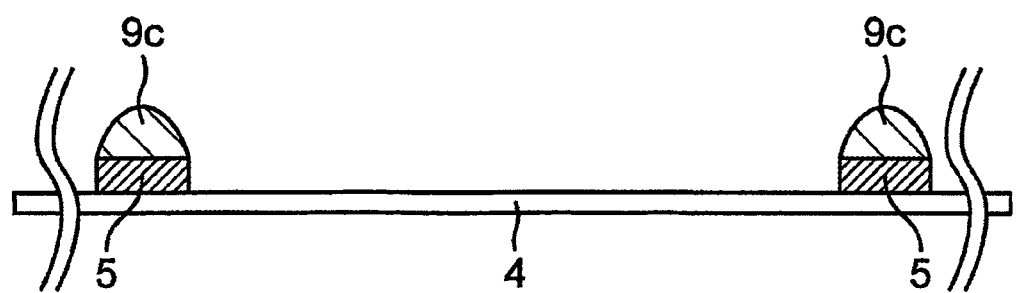
FIG. 8A is a cross-sectional view after applying a first light reflecting resin on the light shielding frame in the method of manufacturing a light emitting device according to the second embodiment.

Here, as shown in FIG. 8A, a first light reflecting resin 9c is applied onto the light shielding frame 5.

The coating amount of the first light reflecting resin 9c is preferably the amount that can form the first light reflecting member 9a between the light transmissive member 3 and the light shielding frame 5 without any gap in the subsequent step of forming a light guide support member. However, it is preferable to adjust the coating amount and the viscosity of the first light reflecting resin 9c such that the first light reflecting resin 9c does not adhere to the first face 3a of the light transmissive member 3, which would otherwise interfere with the release of light from the first face 3a of the light transmissive member 3, which is the emission face of the light emitting device.

The first light reflecting resin 9c can be applied onto the light shielding frame 5 from the nozzle tip of a resin dispenser. The first light reflecting resin 9c, for example, may be applied in the form of a frame to surround the opening of the light shielding frame 5, or in the form of a line or dots along the edges of the opening.

By allowing the first light reflecting resin 9c applied on the light shielding frame 5 to come into contact with the light transmissive member 3, the uncured first light reflecting resin 9c travels along the surfaces of the light shielding frame 5 and the light transmissive member 3 and fills the space between the light transmissive member and the opening while covering the inner lateral faces of the opening 5a of the light shielding frame 5 and the lateral faces of the light transmissive member 3.

The viscosity of the uncured first light reflecting resin 9c is preferably set to, for example, from 5 Pas to 15 Pas. By employing a low viscosity resin material, the flow of the resin material into finer areas can be ensured while reducing the generation of voids.

Light Guide Support Member Forming Step

Here, a plate-shaped light transmissive member 3 having a first face 3a and a second face 3b on the opposite side of the first face 3a where the outer perimeter of the first face 3a is smaller than the inner perimeter of the opening 5a of the light shielding frame 5 and the outer perimeter of the second face 3b is larger than the inner perimeter of the opening 5a of the light shielding frame 5 is used.

Figure 8B:
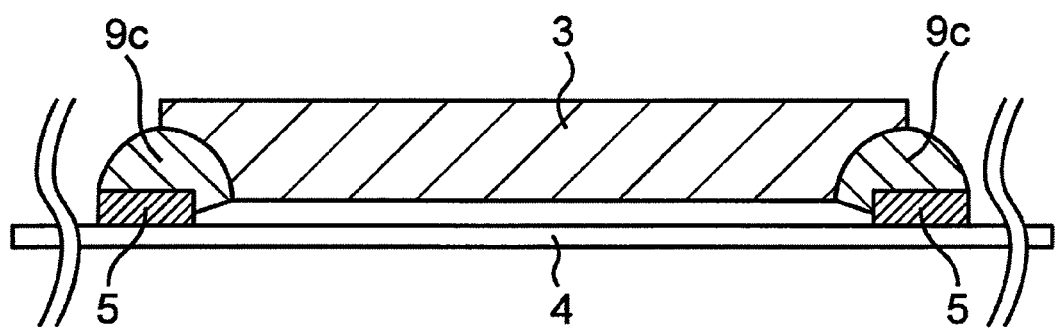
FIG. 8B is a cross-sectional view showing a light transmissive member pressed after coming into contact with the light reflecting resin in the method of manufacturing a light emitting device according to the second embodiment.

By allowing the light transmissive member 3 to come into contact with the first light reflecting resin 9c applied on the light shielding frame 5 so that the first face 3a of the light transmissive member 3 faces the sheet 4 at the position that creates a space between the light transmissive member 3 and the opening 5a of the light shielding frame 5, the first light reflecting resin 9c flows into the space described above as shown in FIG. 8B. The first light reflecting resin 9c may be applied on the light shielding frame 5 in the form of a frame to surround the opening 5a or in several spots in a circular or linear form along the opening 5a in a plan view.

For example, by placing the light transmissive member 3 so that the outer perimeter of its second face 3b is positioned on the outside of the inner perimeter of the opening 5a of the light shielding frame 5 in a plan view and having the lateral faces of the light transmissive member 3 come into contact with the first light reflecting resin 9c applied on the light shielding frame 5, the first light reflecting resin 9c flows towards the first face 3a of the light transmissive member 3 to fill the space between the lateral faces of the light transmissive member 3 and the opening 5a of the light shielding frame 5 in a short period of time. In the case in which both the opening 5a of the light shielding frame 5 and the second face 3b of the light transmissive member 3 are rectangular in shape having short sides and long sides, the light transmissive member 3 and the light shielding frame 5 are preferably arranged so that the distance between a long side of the second face 3b and the corresponding long side of the opening 5a equals the distance between a short side of the second face 3b and the corresponding short side of the opening 5a in a plan view.

Figure 8C:
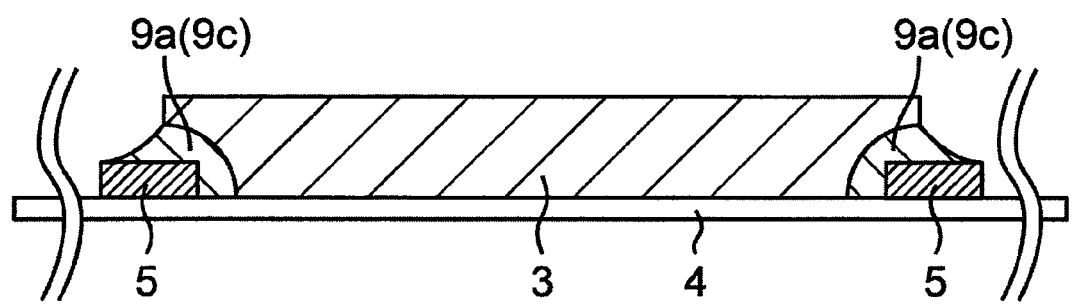
FIG. 8C is a cross-sectional view after forming a light guide support member in the method of manufacturing a light emitting device according to the second embodiment.

After placing the light transmissive member 3 in the opening 5a of the light shielding frame 5 and filling the space described above with a first light reflecting resin 9c, the first light reflecting resin 9c is cured to form the first light reflecting member 9a. In this manner, as shown in FIG. 8C or FIG. 8D, the light guide support member in which the light shielding frame 5 and the light transmissive member 3 are supported by the first light reflecting member 9a can be produced.

The sheet 4 may be removed subsequent to the step of bonding the light guide support member or the step of forming the second light reflecting member.

Light Guide Support Member Bonding Step and Second Light Reflecting Member Forming Step The light guide support member bonding step and the second light reflecting member forming step are similar to those in the method of manufacturing a light emitting device according to the first embodiment, for which the explanations will be omitted.

Method of Manufacturing a Light Emitting Device According to the Third Embodiment The method of manufacturing a light emitting device according to the third embodiment includes: mounting a light emitting element on a substrate; disposing on a sheet a light shielding frame having an opening; applying a coating of a first light reflecting resin on the light shielding frame; forming a light guide support member by forming a first light reflecting member by allowing a light transmissive member, which has a plate shape, a first face and a second face on the opposite side of the first face where the outer perimeter of the first face is smaller than the inner perimeter of the opening and a portion of the outer perimeter of the second face is larger than the opening, to come into contact with the first light reflecting resin at the position to form a space between the light transmissive member and the opening so that the first face opposes the sheet and subsequently be pressed allowing the first light reflecting resin to flow into the space such that the first light reflecting member supports the light shielding frame and the light transmissive member; bonding the light guide support member by bonding the upper face of the light emitting element and the second face to thereby secure the light guide support member on the light emitting element; and forming a second light reflecting member surrounding the light emitting element by filling the space between the substrate and the light shielding frame with a second reflecting resin.

In the method of manufacturing a light emitting device according to the third embodiment, when both the inner parameter of the opening 5a of the light shielding frame 5 and the outer perimeter of the second face 3b of the light transmissive member 3 are substantially rectangular in shape, the light transmissive member 3 used has a second face 3b in which at least one side, preferably two opposing sides, are larger than the corresponding sides of the inner perimeter of the opening 5a. For example, in the case in which both the opening 5a of the light shielding frame 5 and the second face 3b of the light transmissive member 3 are rectangular in shape having long sides and short sides, employing a light transmissive member 3 having a second face 3b whose short sides are larger than the short sides of the opening 5a can produce a light emitting device of the embodiment shown in FIG. 1B, FIG. 2E, and FIG. 2F.

For example, in the step of forming the light guide support member, the light transmissive member 3 is allowed to come into contact with the first light reflecting resin 9c applied on the light shielding frame 5 so that one side of the outer perimeter of the second face 3b of the light transmissive member 3 is positioned on the outside of one side of the inner perimeter of the opening 5a of the light shielding frame 5 in a plan view. This allows the first light reflecting resin 9c to flow towards the light transmissive member 3 to fill the space between that and the opening 5a of the light shielding frame with the first light reflecting resin 9c.

The method of manufacturing a light emitting device according to the third embodiment differs from the method of manufacturing a light emitting device according to the second embodiment in terms of the shape of the light transmissive member 3, but is otherwise similar. In the method of manufacturing a light emitting device according to the second embodiment, the light transmissive member 3 used has a second face 3b whose outer perimeter in its entirety is larger than the inner perimeter of the opening 5a of the light shielding frame 5. In contrast, in the method of manufacturing a light emitting device according to the third embodiment, the light transmissive member 3 employed has a second face 3b portions of the outer perimeter of which are larger than the inner perimeter of the opening 5a. This allows the first light reflecting resin 9c contacted at the portions to flow towards the light transmissive member 3 while allowing the flow of the first light reflecting resin 9c from the second face 3b side to be visually recognized. In this manner, the light emitting device shown in FIG. 1B can be manufactured in which portions of the outer perimeter of the second face of the light transmissive member 3 are positioned on the outside of the inner perimeter of the opening 5a of the light shielding frame 5 while the remaining portions of the outer parameter of the second face are positioned on the inside of the inner parameter of the opening 5a.

As described above, because the method of manufacturing a light emitting device according to the third embodiment is similar to the method of manufacturing a light emitting device according to the second embodiment except for the light transmissive member 3 used, other explanations will be omitted.

The light emitting devices according to the embodiments can be manufactured as described above.

In the foregoing, explanations have been given with reference to the drawings each showing a single light emitting device.

In the methods of manufacturing a light emitting device according to the first to third embodiments, however, it is preferable to manufacture a plurality of light emitting devices in groups by using the substrate and light shielding frame defined into unit regions corresponding to individual light emitting devices to subsequently be divided into individual light emitting devices.

For example, a substrate that includes a plurality of unit regions arranged in multiple rows (n rows) and multiple columns (m columns) may be used to provide substrates and light shielding frames.

Moreover, a light shielding frame that includes a plurality of unit regions arranged in multiple rows (n rows) and multiple columns (m columns) corresponding to substrates may be used to provide light shielding frames. Alternatively, for example, a plurality of light shielding frames (n×m) forming multiple rows (n rows) and multiple columns (m columns) corresponding to substrates may be employed, using each frame as a unit region.

A plurality of light emitting devices are produced as described below.

(1) In the step of mounting light emitting elements, one or more light emitting elements are mounted in each unit region described above.

(2) In the case of performing a resin wall forming step before the step of forming a light guide support member in the method of manufacturing a light emitting device according to the first embodiment, resin walls are formed per unit region in the positions providing a prescribed space from the opening and the light transmissive member with the opening and the light transmissive member interposed between the resin walls.

In the case of employing light shielding frames having a plurality of unit regions (n×m) in multiple rows (n rows) and columns (m columns), for example, forming a plurality of resin walls in the column direction that are in parallel to one another can form the resin walls for the plurality of unit regions with pieces of continuous resin walls, thereby enabling efficient formation of the resin walls.

(3) In the step of bonding the light guide support member, the light guide support members are individually bonded so as to collectively cover the one or more light emitting elements 1 mounted in each unit region described above.

(4) In the step of forming the second light reflecting member, the space between the substrate and the light shielding frame in each unit region is filled with a light reflecting resin.

Subsequent to the step of forming the light reflecting member, in the dividing step, the light emitting devices are divided into individual pieces by dividing the light reflecting member and the substrate per unit region. The division can be achieved by cutting using a blade or the like.

Considering this dividing into unit regions, the cutting positions used when dividing into unit regions are preferably distant from the outer perimeters of the light shielding frames 5. In other words, the light shielding frame 5 is slightly smaller than the outer shape of the light emitting device. In this case, for example, a plurality of light shielding frames smaller than the outer shapes of the light emitting devices may be used as the light shielding frames.

According to the methods of manufacturing a light emitting device described above, the light emitting devices can be manufactured inexpensively because a plurality of light emitting devices are produced in groups and then divided into individual light emitting devices.

What is claimed is:

1. A method of manufacturing a light emitting device, the method comprising:
   mounting a light emitting element on a substrate;
   disposing a light shielding frame on a sheet, the light shielding frame having an opening;
   disposing a plate-shaped light transmissive member in the opening, the plate-shaped light transmissive member having a first face and a second face opposite the first face, wherein the second face is larger than the first face, wherein an outer perimeter of the first face is smaller than an inner perimeter of the opening, such that the first face opposes the sheet and a space is located between the light transmissive member and the opening, and wherein, in a plan view as seen from above, the light transmissive member is placed such that at least a portion of an outer perimeter of the second face is positioned outward of the inner perimeter of the opening;
   forming a light guide support member by filling the space with a first light reflecting member such that the first light reflecting member supports the light shielding frame and the light transmissive member;
   bonding the light guide support member by bonding an upper face of the light emitting element and the second face of the light transmissive member, to thereby secure the light guide support member on the light emitting element; and
   forming a second light reflecting member surrounding the light emitting element by filling the space between the substrate and the light shielding frame with a second reflecting resin.

2. The method of manufacturing a light emitting device according to claim 1, further comprising, before the step of forming a light guide support member, forming resin walls at opposing positions spaced from the opening and the light transmissive member with the opening and the light transmissive member interposed between the resin walls.

3. The method of manufacturing a light emitting device according to claim 2, further comprising, after forming the light guide support member, removing the resin walls.

4. The method of manufacturing a light emitting device according to claim 1, wherein:

the substrate and the light shielding frame include a plurality of unit regions;

in the mounting step, one or more light emitting elements are mounted in each unit region;

in the step of forming the light guide support member, a light guide support member is formed in each unit region;

in the step of bonding the light guide support member in each unit region, the light guide support member in each unit region is bonded in such a manner as to collectively cover the respective one or more light emitting elements mounted in that unit region;

in the step of forming the second light reflecting member, the space between the substrate and the light shielding frame in each region is filled with the second light reflecting resin; and the method further comprises, subsequent to the step of forming the second light reflecting member, dividing the substrate into individual unit regions.

5. The method of manufacturing a light emitting device according to claim 1, further comprising, subsequent to the step of bonding the light guide support member, removing the sheet.

6. The method of manufacturing a light emitting device according to claim 1, wherein, in the step of bonding the light guide support member, the light transmissive member is bonded such that the outer perimeter of the first face of the light transmissive member is positioned on the inside of an outer perimeter of the light emitting device in a plan view as seen from above.

7. The method of manufacturing a light emitting device according to claim 1, wherein the light transmissive member contains a phosphor.

* * * * *